(12) United States Patent
Zhou et al.

(10) Patent No.: US 9,898,561 B2
(45) Date of Patent: Feb. 20, 2018

(54) BEHAVIORAL SIMULATION MODEL FOR CLOCK-DATA RECOVERY PHASE-LOCKED LOOP

(71) Applicant: Altera Corporation, San Jose, CA (US)

(72) Inventors: Bo Zhou, San Jose, CA (US); Ajay Nagarandal, Fremont, CA (US)

(73) Assignee: Altera Corporation, San Jose, CA (US)

( * ) Notice: Subject to any disclaimer, the term of this patent is extended or adjusted under 35 U.S.C. 154(b) by 328 days.

(21) Appl. No.: 14/723,153

(22) Filed: May 27, 2015

(65) Prior Publication Data

US 2016/0350455 A1    Dec. 1, 2016

(51) Int. Cl.
| | | |
|---|---|---|
| H04L 7/00 | (2006.01) | |
| G06F 17/50 | (2006.01) | |
| H03L 7/08 | (2006.01) | |
| H04L 7/033 | (2006.01) | |

(52) U.S. Cl.
CPC ........ *G06F 17/5009* (2013.01); *H03L 7/0807* (2013.01); *H04L 7/0016* (2013.01); *H04L 7/0331* (2013.01)

(58) Field of Classification Search
CPC . G06F 17/5009; H04L 7/0331; H04L 7/0016; H03L 7/0807
See application file for complete search history.

(56) References Cited

U.S. PATENT DOCUMENTS

| | | | | |
|---|---|---|---|---|
| 6,133,769 A | * | 10/2000 | Fontana ................ | H03L 7/0891 327/156 |
| 7,279,987 B1 | * | 10/2007 | Kaszynski ................ | H03L 7/08 331/1 A |
| 9,036,764 B1 | * | 5/2015 | Hossain .................. | H03L 7/087 375/355 |
| 2002/0114417 A1 | * | 8/2002 | McDonagh ............... | H03L 7/08 375/376 |
| 2006/0109940 A1 | * | 5/2006 | Beukema .............. | H04L 7/0058 375/350 |
| 2007/0047689 A1 | * | 3/2007 | Menolfi ................. | H03D 3/006 375/376 |
| 2007/0164829 A1 | * | 7/2007 | Ko ........................ | H03L 7/0893 331/17 |
| 2009/0016414 A1 | * | 1/2009 | Lillo ...................... | G01S 19/47 375/150 |

(Continued)

FOREIGN PATENT DOCUMENTS

WO    0145261 A2    6/2001

OTHER PUBLICATIONS

Extended EP Search Report for EP Application No. 16171678.2 dated Oct. 13, 2016; 7 Pages.

*Primary Examiner* — Kenneth Lam
(74) *Attorney, Agent, or Firm* — Fletcher Yoder, P.C.

(57) ABSTRACT

Method and non-transitory computer-readable medium storing instructions for simulating a phase-locked loop measures a first phase of a data signal and a second phase of a reference clock signal in a phase-locked loop to be simulated, filters the first phase of the data signal by a threshold function of a lock detection module of the phase-locked loop to be simulated, and adjusts the second phase of the reference clock signal to align with the filtered first phase of the data signal.

27 Claims, 6 Drawing Sheets

(56) References Cited

U.S. PATENT DOCUMENTS

| | | | |
|---|---|---|---|
| 2009/0086872 A1* | 4/2009 | Liu | H03L 7/0814 |
| | | | 375/371 |
| 2010/0308880 A1* | 12/2010 | Wang | H03L 7/0807 |
| | | | 327/163 |
| 2011/0025913 A1* | 2/2011 | Sugiyama | H03L 7/0807 |
| | | | 348/500 |
| 2011/0096881 A1* | 4/2011 | Villarino-Villa | H04L 1/205 |
| | | | 375/354 |
| 2011/0188621 A1* | 8/2011 | Asaduzzaman | H03L 7/0814 |
| | | | 375/374 |

* cited by examiner

BEHAVIORAL SIMULATION MODEL FOR CLOCK-DATA RECOVERY PHASE-LOCKED LOOP

FIELD OF THE INVENTION

This invention relates to systems and methods for providing fast and reliable behavioral simulation of a clock-data recovery (CDR) phase-locked loop (PLL) with efficient noise recovery. Particularly, this invention can be used to simulate a CDR PLL implemented on a programmable integrated circuit device, such as a field-programmable gate array (FPGA) or other type of programmable logic device (PLD) to facilitate programming of the PLD.

BACKGROUND OF THE INVENTION

A phase-locked loop (PLL) is, by nature, a closed-loop frequency control component that operates based on the phase difference between input and output signal of a voltage-controlled oscillator (VCO). PLL circuits can be used to generate an output clock signal whose phase is related to the phase of an input reference clock signal. More advanced PLLs, such as a clock-data recovery PLL (CDR PLL), are often used in high speed serial interface (HSSI) circuits. In addition to generating an output clock signal with the desired frequency based on the reference clock signal, the CDR PLL also tracks the data signal to ensure that the edge of the output clock signal is always in the middle of data eye of the data signal.

However, the data signal and the reference clock signal are inherently independent of each other. As such, CDR PLL circuits that track and align both data and reference clock signals with the output clock signal are complicated. Hardware design engineers rely on simulation models to gradually build up a system such as a CDR PLL circuit and to verify its functionality. This process presents several challenges, resulting from both the presence of signal noise in the data and reference clock signals and the lack of fast and reliable simulation models that can provide sufficient abstraction with short runtime.

In particular, a special situation called a race condition may occur when a data signal edge and a reference clock signal edge arrive simultaneously. In such situations, the desired simulation model must be able to produce glitch-free stable signal that are independent of event sequences. In addition, it has been difficult to model certain signal noise present in a CDR PLL circuit because a PLL is a mixed-signal component in which all analog transitions happen on the continuous time domain, whereas known simulators are driven by discrete events. It is difficult to customize the desired simulation model for an analog block while retaining enough system-level abstraction and overall accuracy.

Lastly, the ability to recover from a noisy reference clock signal or a noisy data signal quickly and efficiently (in terms of required computing resources during simulation) is extremely valuable. When jitter or parts-per-million (PPM) error are present, measurement of both the reference clock signal and the data signal may become unreliable. The desired simulation model should be able to simulate physical hardware behavior and efficiently estimate clock frequency and phase in a timely and accurate manner.

Existing simulation models emulate data tracking by fixing the edge of the reference clock at the middle of the data eye, which is an inaccurate representation of real data tracking behavior. Furthermore, known simulation models require a tradeoff between supporting complex simulation features and fast simulation runtime.

SUMMARY OF THE INVENTION

The simulation models, methods and systems proposed herein allow both goals to be satisfied simultaneously. Complex simulation features that need to be accounted for, such as jitter and PPM error, are merged into a single rounding-off error to allow for fast runtime operations, while the simulation model used herein is continually updated to ensure sufficient accuracy.

Therefore, in accordance with embodiments of the present invention, there is provided a simulation model for simulating a phase-locked loop. The simulation model measures a first phase of a data signal and a second phase of a reference clock signal in a phase-locked loop to be simulated. The simulation model filters the first phase of the data signal by a threshold function of a lock detection module of the phase-locked loop to be simulated and adjusts the second phase of the reference clock signal to align with the filtered first phase of the data signal. In some embodiments, the threshold function emulates a low-pass filter of a phase-locked loop.

While adjusting the second phase of the reference clock signal, the simulation model calculates a difference between an actual arrival time of the next data edge and the predicted arrival time of the next data edge. After determining whether the next data edge is valid based on the calculated difference, the method updates the prediction model based on the calculated difference in response to determining that the next data edge is valid.

In some embodiments, the simulation model notifies the lock detection module in response to determining that the next data edge is not valid. In some embodiments, the simulation model filters the data signal and the reference clock signal to remove jitter and PPM errors. Jitter and the PPM errors are represented by a rounding-off error having an upper boundary in the simulation model, and the lock detection module compares the rounding-off error with a threshold.

In some embodiments, the simulation model calculates an amount of lag in the data signal with respect to the reference clock signal and applies a delay to the reference clock signal based on the calculated amount of lag. The amount of lag is calculated during initialization of the phase-locked loop.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

Figure 1:
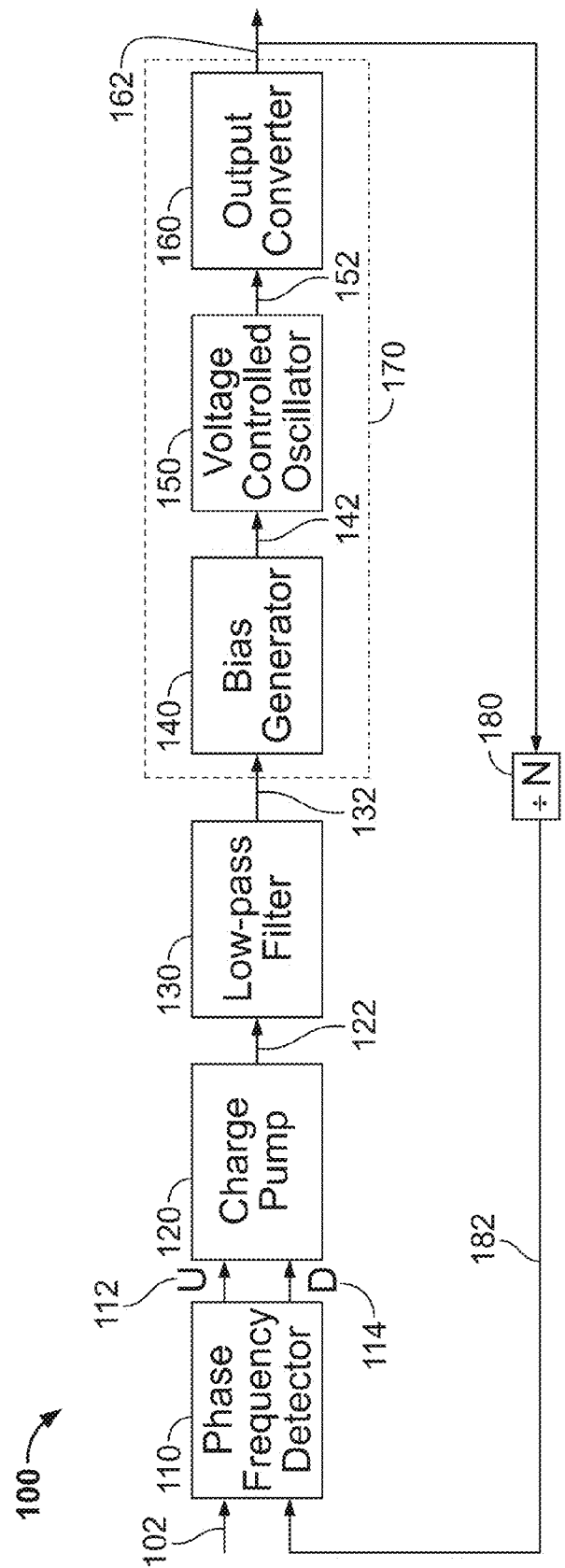
FIG. 1 shows a conceptual block diagram of a PLL in accordance with a first variant of an embodiment of the invention.

FIG. 1 shows a conceptual block diagram of an ordinary PLL 100. PLL 100 includes phase frequency detector 110, charge pump 120, low-pass filter 130, and voltage-to-frequency converter (VFC) 170, configured as shown in FIG. 1. VFC 170 further includes bias generator 140, voltage-controlled oscillator 150, and output converter 160. VFC 170 adjusts frequency of output signal 162 based on applied voltage of signal 132. Output signal 162 is passed through feedback divider 180 to be fed back, as input signal 182, to the input of phase frequency detector 110. Input signal 182 is continually compared with input signal 102 at phase frequency detector 110. The phase difference between input signal 182 and input signal 102 is used to generate an up signal 112 and a down signal 114, which adjust charge pump 120 to output signal 122. Low pass filter 130 may be employed to smooth variations in output signal 122, resulting in signal 132 which controls VFC 170. Physically, most PLLs rely on the negative feedback loop as shown in circuitry 100 to perform phase alignment between input signal 102 and input signal 182 and to converge to a stable frequency for output signal 162.

Figure 2A:
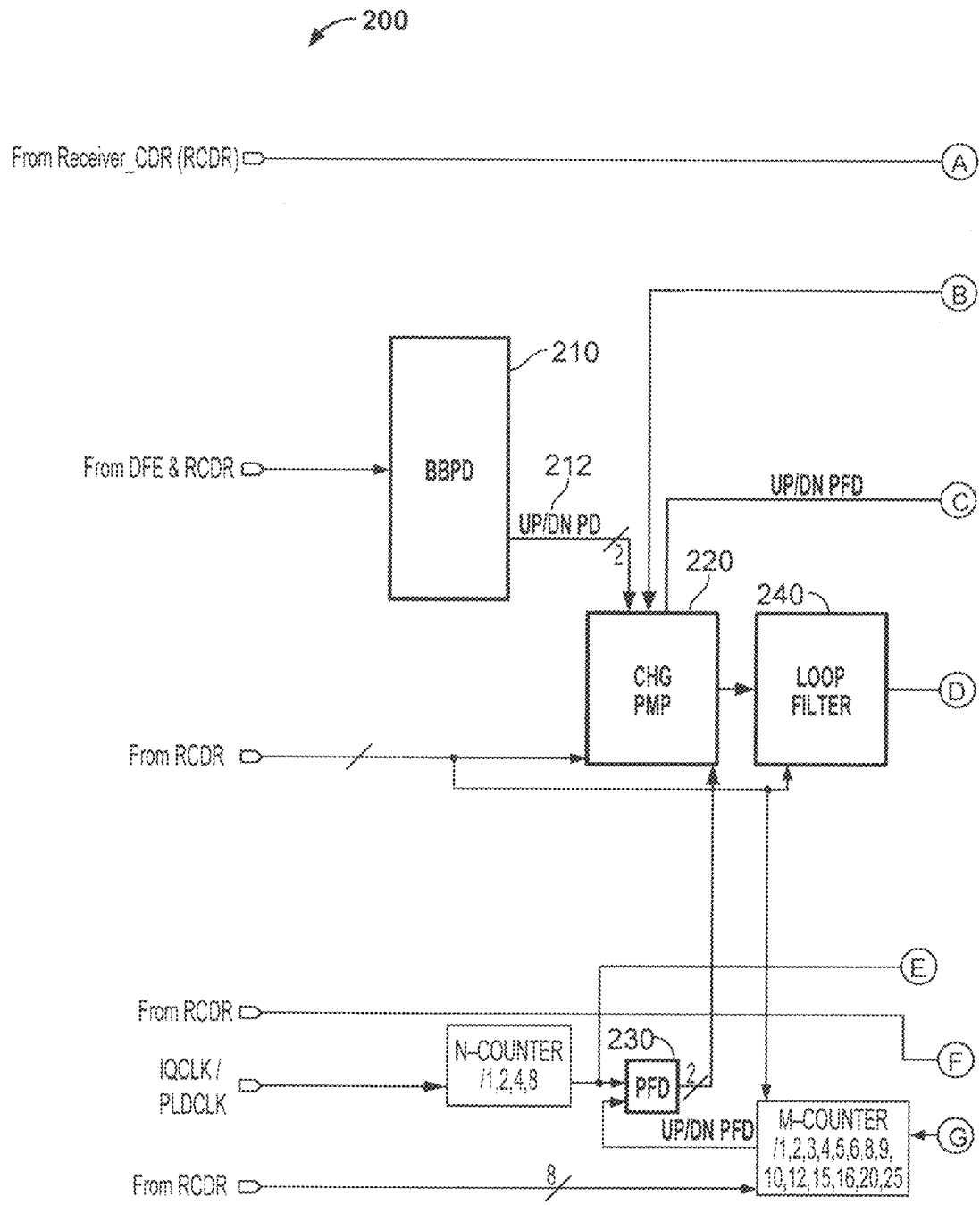
FIGS. 2A and 2B (hereafter collectively referred to as "FIG. 2") show an exemplary circuit diagram of a CDR PLL, whose behavior and components are simulated in a desired simulation model described herein in accordance with a second variant of that embodiment of the invention.
Figure 2B:
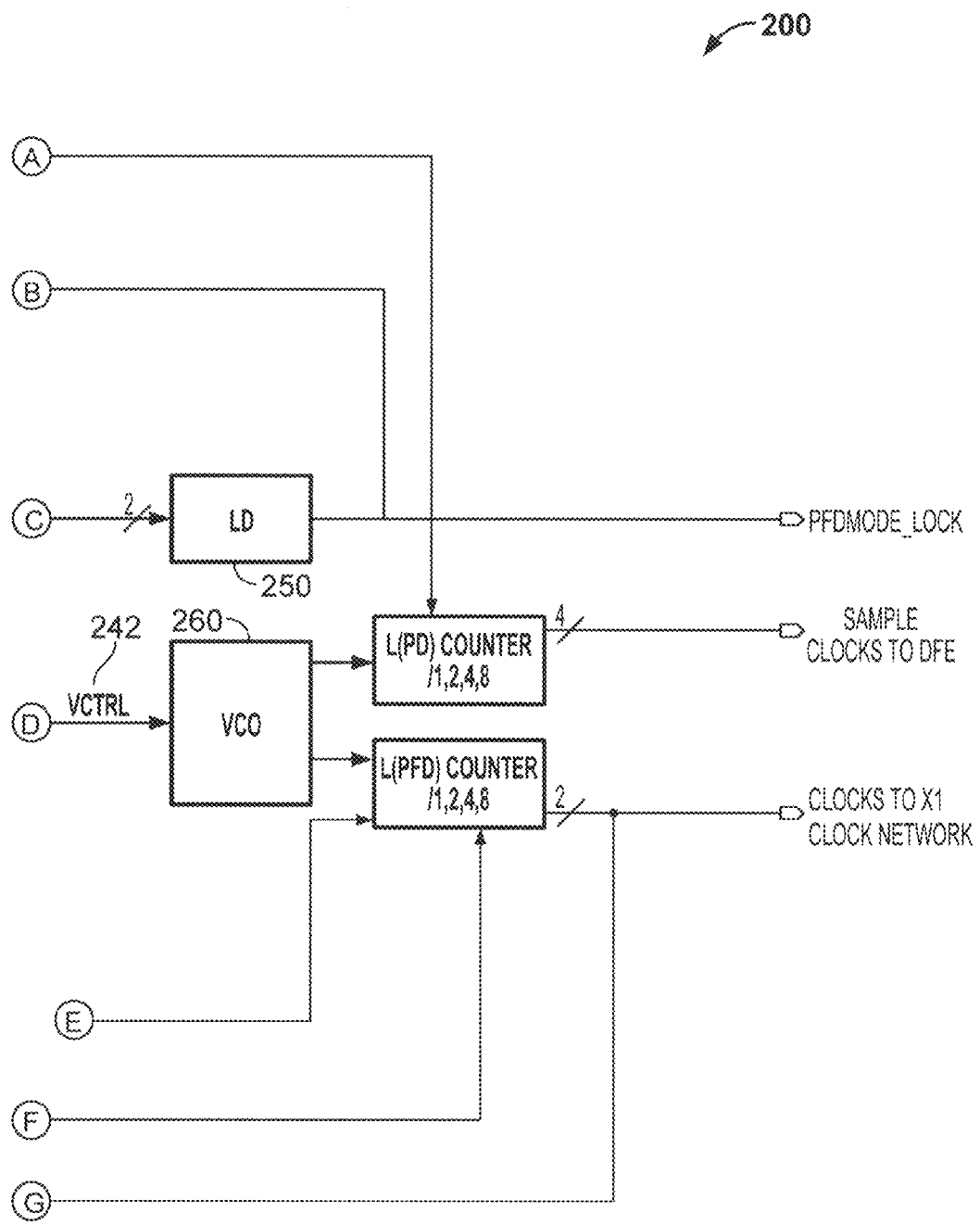

FIG. 2 shows an exemplary circuit diagram of CDR PLL circuitry 200, whose behavior and components are simulated in embodiments of a simulation model described herein. CDR PLL Circuitry 200 includes bang-bang phase detector (BBPD) 210, charge pump (CHG PMP) 220, phase-frequency detector (PFD) 230, loop filter 240, lock detector 250, and voltage-controlled oscillator (VCO) 260.

The main function of CDR PLL circuitry 200 is to minimize and eliminate phase offset between a reference clock signal and a data signal, and to re-time the data signal to the reference clock signal. BBPD 210 produces charge-pump current 212 based on the sign of the phase error between the reference clock signal and the data signal received from a digital feedback equalizer (DFE) and receiver clock data recovery (RCDR) circuitry. CHG PMP 220 is controlled by a control signal from RCDR circuitry to utilize charge-pump current 212 to drive loop filter 240. Loop filter 240 integrates charge-pump current 212 to produce control voltage ($V_{ctrl}$) 242, which is then applied to VCO 260 to vary the phase and frequency of the reference clock signal. In some embodiments, lock detector 250 generates a PLL lock signal (e.g., PFDMODE_LOCK) to indicate whether the reference clock signal and the data signal in the CDR PLL are in lock (i.e., whether the PLL output clock is usable).

In reality, multiple signal noise and disturbance sources may affect the clock synthesizing performance of CDR PLL circuitry 200 as described above. Two of the most important sources are PPM error and jitter.

PPM error refers to differences between the reference clock signal and the data signal due to systematic errors inherent in the hardware. For example, an oscillator having an error of 0.001% will cause the clock generated from the oscillator to be off by almost one second per day. If PPM errors persist and transceivers cannot accurately account for the accumulated PPM errors, data loss will eventually occur.

Figure 3:
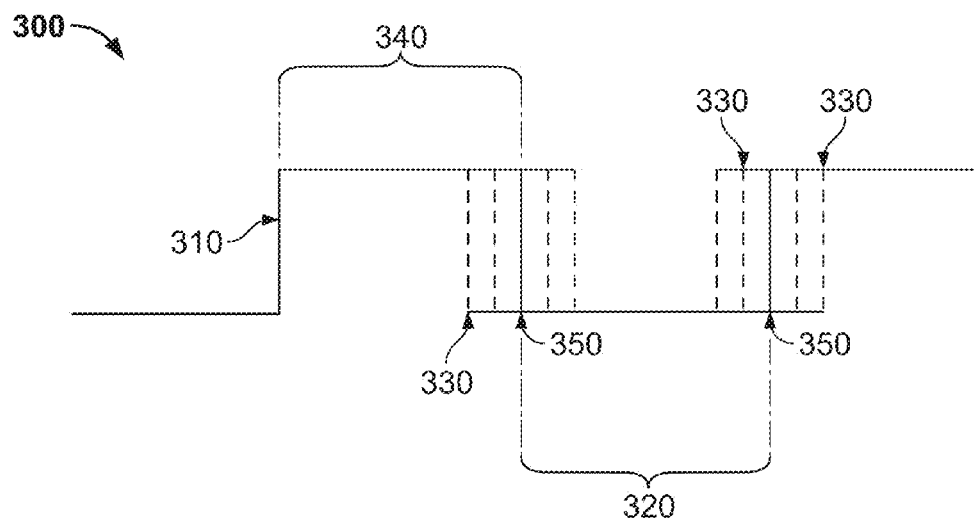
FIG. 3 shows the presence of jitter on a signal which may be measured and/or corrected according to a third variant of that embodiment of the invention.

Jitter refers to the situation in which a signal transaction deviates from the theoretical or ideal situation. This is illustrated in FIG. 3, which shows the presence of jitter on a signal. In FIG. 3, signal 300 is expected to flip at edges 350 (with respect to reference edge 310), with an ideal unit interval of 320 or 340. However, in reality, the signal edges may appear at locations 330. This unexpected shift of signal edges, alone with other signal variations such as skew or cross-coupled noise, is commonly referred to as jitter. CDR PLL circuitry 200 must handle jitter on both the reference clock signal and the data signal.

The following analysis describes certain embodiments of a simulation model in accordance with the present invention.

There are two paths on an actual CDR PLL as discussed in relation to CDR PLL circuitry 200—a data signal path and a reference clock path. In simulation, both paths may be viewed as binary sequences:

$$D = \{d_n | d_n = 1 \text{ or } 0, d_{n-1} \neq d_n, t_n^d \in R \geq 0\}$$

$$C = \{c_n | c_n = 1 \text{ or } 0, c_{n-1} \neq c_n, t_n^c \in R \geq 0\}$$

where binary sequences D and C denote signal transactions in data signal path and reference clock path, respectively, and $t_n$ is the time stamp for each signal transaction happening on $d_n$ and $c_n$. For the reference clock path C, the measured clock period may be defined as:

$$T_n^c = t_n^c - t_{n-1}^c = T + \epsilon$$

where $T_n^c$ is the measured clock period of the reference clock, T is the real clock period, and $\epsilon$ is the error term capturing the clock inaccuracies.

For simulations, the inaccuracy term $\epsilon$ can come from jitter, frequency drift, or simple numeric errors. Similarly, in the case of the data signal path (D), the timing of the data signal edge and the data signal period ($t_n^d - t_{n-1}^d$) is not predictable because the data pattern could be randomly generated. Therefore, a CDR PLL circuit simulator that tolerates jitter and PPM errors may be designed as a filter that recovers the correct phase and frequency from noisy data signal and reference clock signal.

The frequency and phase of the incoming noisy data signal and reference clock signal can be measured as follows:

For frequency of the reference clock: $F^c = f(T_n^c) = f(t_n^c - t_{n-1}^c)$

For frequency and phase of the data:

$$F^d = \frac{1}{P_n^d} \text{ and } P_n^d = t_n^d - t_{n-1}^d$$

In measuring the frequency $F^c$ of the reference clock, a filter f is applied to the measured period of the reference clock in order to remove noise. During simulation, it can be assumed that the noise present in the reference clock signal follows a normal distribution. As such, a simple averaging operation would simulate a stable frequency with sufficient accuracy as follows:

$$F_n^C = \frac{K}{\sum_{k=n-K}^{k=n} (t_k^c - t_{k-1}^c)} \quad (1)$$

where K is the number of samples needed for averaging. Note that $F_n^C$ (with upper-case C in the superscript) denotes actual values, and $F^c$ (with lower-case c in the superscript) denotes measured or momentary values. It will be understood by one skilled in the art that other filtering methods also can be applied here to simulate the frequency of the reference clock $F_n^C$.

In measuring frequency $F^d$ (otherwise known as the momentary data rate) and phase $P_n^d$ of the data signal, only the time stamp of the last data edge $t_n^d$ and the period of the data transaction $P_n^d$ are recorded. Thereafter, an outlier detector may be added along the data signal path to simulate the properties of low-pass filter 130 or loop filter 240 as shown in FIG. 1 and FIG. 2. The outlier detector helps eliminate abnormal data signal and perform data correction where necessary. Because the data signal arrives at a fixed data rate $F^D$ (i.e., there are a fixed number (m) of data bits per unit of time), the data transaction period $P_n^d$ measured above should be an integer multiple of the minimum data period $$\left(\frac{1}{F^D}\right).$$

Namely, the following equation should hold:

$$P_n^d = m \times \frac{1}{F^D} \quad (2)$$

where m is a non-zero integer (m=1, 2, 3 . . . ) that indicates the number of data bits per data transaction period.

In Eqn. (2), only $P_n^d$ is measured and known. Both m and $F^D$ are unknown variables. However, the momentary data rate ($F^d$) should be very close to the actual data rate ($F^d$) with some small error ($\delta$). Therefore, Eqn. (2) can be rewritten as:

$$m = P_n^d(F^d + \delta) = m' + P_n^d \delta \quad (3)$$

where m' is the measured number of data bits per data transaction period. Although there are still two unknown variables in this equation (m and $P_n^d \delta$), it is easy to estimate both. The value of m is an integer and therefore can be estimated with the following rounding operation:

$$m = [m'] = [P_n^d F^d] \quad (4)$$

where [ ] is a mathematical rounding operator. The value of $P_n^d \delta$ is normally a small variation that is negligible.

Eqn. (3) folds all variations between the data signal path and the reference clock path into the rounding-off error term ($P_n^d \delta$) and makes an implicit assumption that the upper boundary of $P_n^d \delta$ would not cause an erroneous rounding operation in m'. In reality, this assumption may become invalid under two scenarios. First, burst error may occur when abnormal data edges appear in a very short period of time. Burst error will result in a small $P_n^d$, but a very large $\delta$. Consequently, the rounding-off error term $P_n^d \delta$ may exceed the upper boundary to cause the result of rounding m' to be different from m. Second, when there is a long period of data silence while PPM errors between a reference clock signal and a data signal persist, $\delta$ remains a small constant but $P_n^d$ becomes extremely large. For example, two sides of a communication serial link may have clocks that run on slightly different frequencies because they are completely independent of each other. In the absence of any data communication over a long period of time, the PLL frequency could drift and eventually lose the lock (i.e., the PLL lock signal indicates an unlocked condition). The challenges posed by the above two scenarios are resolved by the threshold function as explained in relation to FIG. 4 below.

Figure 4:
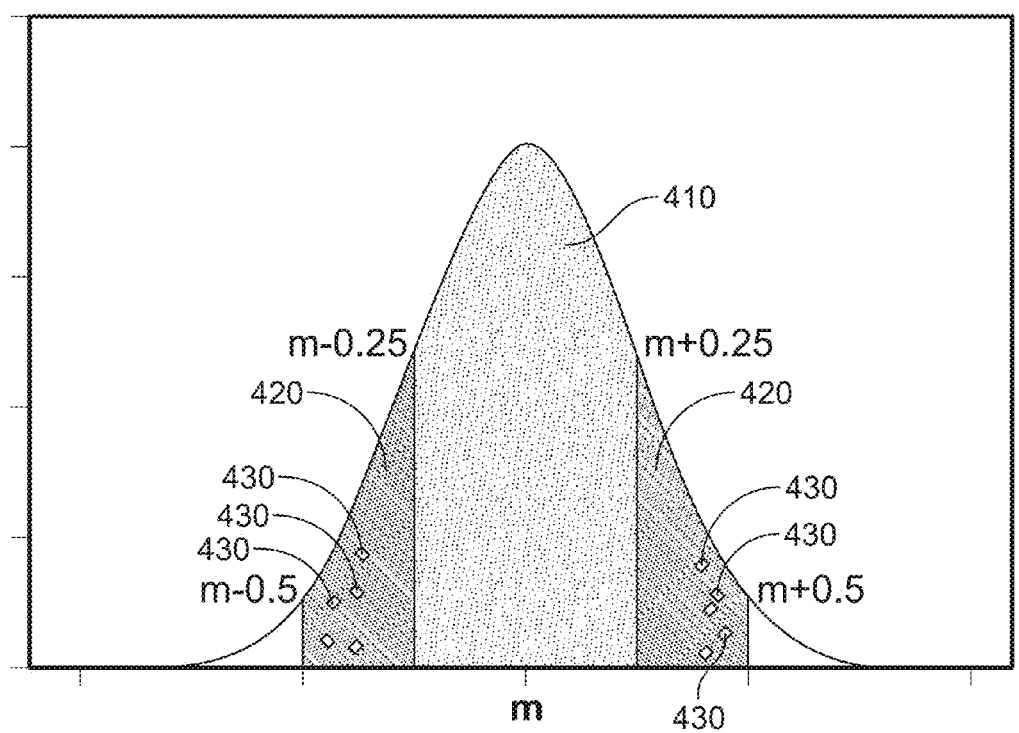
FIG. 4 shows a threshold function applied to rounding-off errors that may be present in a desired simulation model of a fourth variant of an embodiment of the invention.

FIG. 4 describes a threshold function that is applied to the rounding-off error $P_n^d \delta$ that may be present in the desired simulation model. In FIG. 4, a threshold of 0.25 is used to determine how the desired simulation model responds to the rounding-off error. When the $P_n^d \delta$ term (i.e., the rounding-off error) |m−m'|<0.25, the error is within normal range 410 and the simulation will continue. When the $P_n^d \delta$ term is over the threshold, a lock detection module such as lock detector 250 will respond accordingly and abandon the outlier data points. In some embodiments, when 2 consecutive over-the-threshold events happen, the PLL lock will be lost (i.e., the PLL lock signal will indicate an unlocked condition). In some other embodiments, many m's may be present in the over-the-threshold area 420 as outliers 430. This may indicate chaotic data generated during PLL initialization, and the signals during this period cannot be relied on. The selection of the threshold value (0.25) is based on the passband of low-pass filter 130 or loop filter 240, and can be any other value as may be understood by one of ordinary skill in the art.

Once the PLL becomes stabilized, the momentary data rate $$\left(m \times \frac{1}{P_n^d} = F_n^d\right)$$

will become relatively stable. Similar to the averaging operation as applied in the frequency measurement of the reference clock as shown in Eqn. (1), a weighted averaging operation can be adopted to remove noise in the data signal path as well:

$$F_n^D = \sum_{k=n-K}^{k=n} \alpha_k \frac{[P_k^d F^d]}{P_k^d} \quad (4)$$

where $\alpha_k$ is a predefined weight that follows $\Sigma_{k=n-K}^{k=n} \alpha_k = 1$. Clearly, in the special case where $$\alpha_k = \frac{1}{K},$$

Eqn. (4) becomes a non-weighted version of averaging. In reality, it is advantageous to implement a scheme that places more weight on the most recent measurements because such a scheme would allow the simulation to become more sensitive to the latest change. The above averaging scheme was chosen based on the instant runtime and accuracy requirements. It is understood to a skilled person that other weighting and averaging schemes can be applicable here.

In view of $F_n^C$ and $F_n^D$ as defined in Eqn. (1) and Eqn. (4), the frequencies of the reference clock path and that data signal path can be successfully recovered and simulated. A remaining task is to perform phase alignment, which is to ensure that the generated clock signal can track the data edge, and preferably always sample the data signal at the middle of the data eye. The following discussion illustrates how phase alignment may be carried out in accordance with some embodiments of the present invention.

Assuming that the minimum communication interval on both the reference clock path and the data signal path is defined by $T=1/\overline{F^D}$, where $\overline{F^D}$ is the expected data rate for both $F_n^C$ and $F_n^D$ (i.e., the ideal data rate). In the ideal case, the data signal path and the reference clock path can be formulated as follows:

$$D=f(iT+\Delta)$$

$$C=g(jT) \quad (5)$$

where i and j are integers. Both f(t) and g(t) are binary functions which flip at a specified time t, and $\Delta$ is a fixed amount of lag that the data signal path carries.

In reality, jitter, distortion, and other system-level inaccuracies (such as the independent clocks on two sides of a communication serial link) need to be considered. Therefore, Eqn. (5) becomes:

$$D=f(i/F_D+\Delta+\theta)$$

$$C=g(j/F^C) \quad (6)$$

where θ is the phase distortion appearing in data transactions. The goal is to adjust the phase of C such that its edge is always aligned with D. In the model according to embodiments of this invention, this goal will be accomplished in two stages, which correspond to reducing $\Delta$ and θ, respectively.

The calculation of $\Delta$ is done at the time of initialization of the CDR PLL model, after both the reference clock signal and the data signal are stable, which happens in accordance with the description on variations of m as illustrated in relation to FIG. 4. By measuring the amount of lag between the reference clock signal and the data signal, a fixed amount of delay may be applied to the reference clock signal generated. This will cause the reference clock signal and the data signal to be roughly aligned with each other.

To further improve the alignment, a prediction-adjustment schema may be employed to enhance the data tracking ability of the CDR PLL model. This extra measure is especially critical for high data rate applications, where the margin for error is much tighter. The CDR PLL has no information on when the next data edge will arrive. However, prior knowledge of the expected behavior of the data signal may be relied on for statistical analysis. The following discussion illustrates the steps that the desired simulation model performs when a new measurement of the data signal is received. In some embodiments, a Kalman filter may be used for this purpose.

1. Prediction

At the end of processing each data signal edge, the desired simulation model predicts when the next data edge is most likely going to appear. In its simplest form, the prediction can be carried out by adding T to the current time and using the result as the prediction of the next data edge. This simple prediction schema would be reasonable in a noise-free environment. In reality, besides T, one could add a small correction term that is the weighted sum of the last K prediction errors to the prediction schema to accomplish this step.

2. Comparison

Upon detecting a new data signal edge, a phase comparator compares the phase of the new data signal edge with the prediction and determines whether the new data signal is a valid data transaction. If the measured phase is far from the predicted phase T, the lock detection module such as lock detector 250 will be notified. If the measured phase is within an acceptable range, record the latest prediction error.

3. Update Model

As long as the CDR PLL being modeled is still locked, the above-described prediction schema will be continually updated. Similarly, the prediction error distribution will be monitored and adjusted based on the latest prediction error. In this way, the prediction schema is constantly updated with posterior statistics in order to account for slow changes such as clock drift (as described above in connection with Eqn. (3) and Eqn. (4)).

Figure 5:
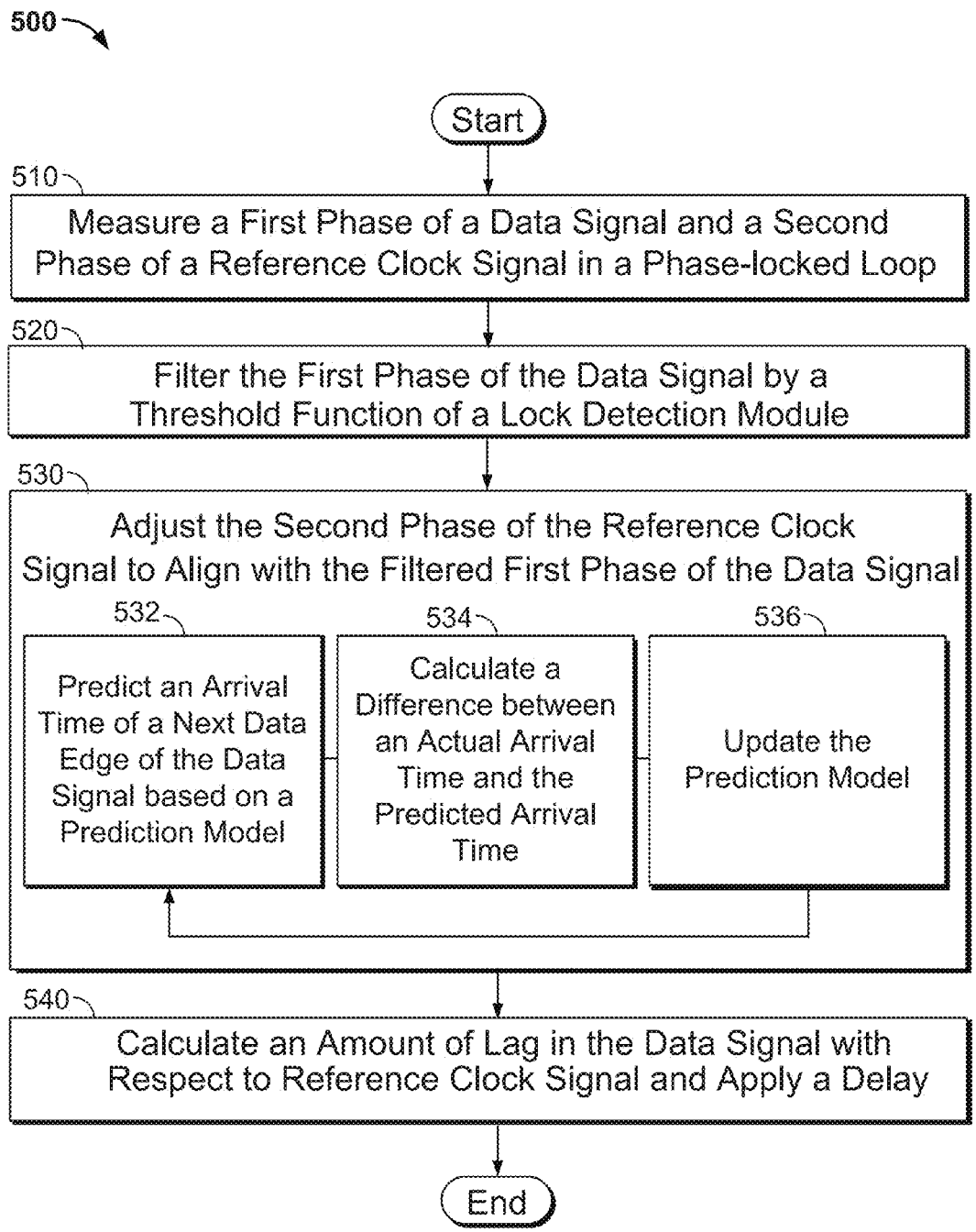
FIG. 5 is a flow diagram of a method according to an embodiment of the present invention for simulating a CDR PLL circuit.

A method according to an embodiment 500 of the invention is diagrammed in FIG. 5. At 510, a first phase of a data signal and a second phase of a reference clock signal is measured in a phase-locked loop. At 520, the first phase of the data signal is filtered by a threshold function of a lock detection module. At 530, the second phase of the reference clock signal is adjusted to align with the filtered first phase of the data signal. At 532, an arrival time of a next data edge of the data signal is predicted based on a prediction model. At 534, a difference between an actual arrival time and the predicted arrival time of the next data edge of the data signal is calculated. At 536, the prediction model is updated based on the calculated difference, and the simulation runs from 532 to 536 on a continuous loop. At 540, an amount of lag in the data signal with respect to the reference clock signal is calculated, and a delay is applied to the reference clock signal based on the calculated amount of lag.

Thus it is seen that a system and method for simulating clock-data recovery phase-locked loops have been provided.

Figure 6:
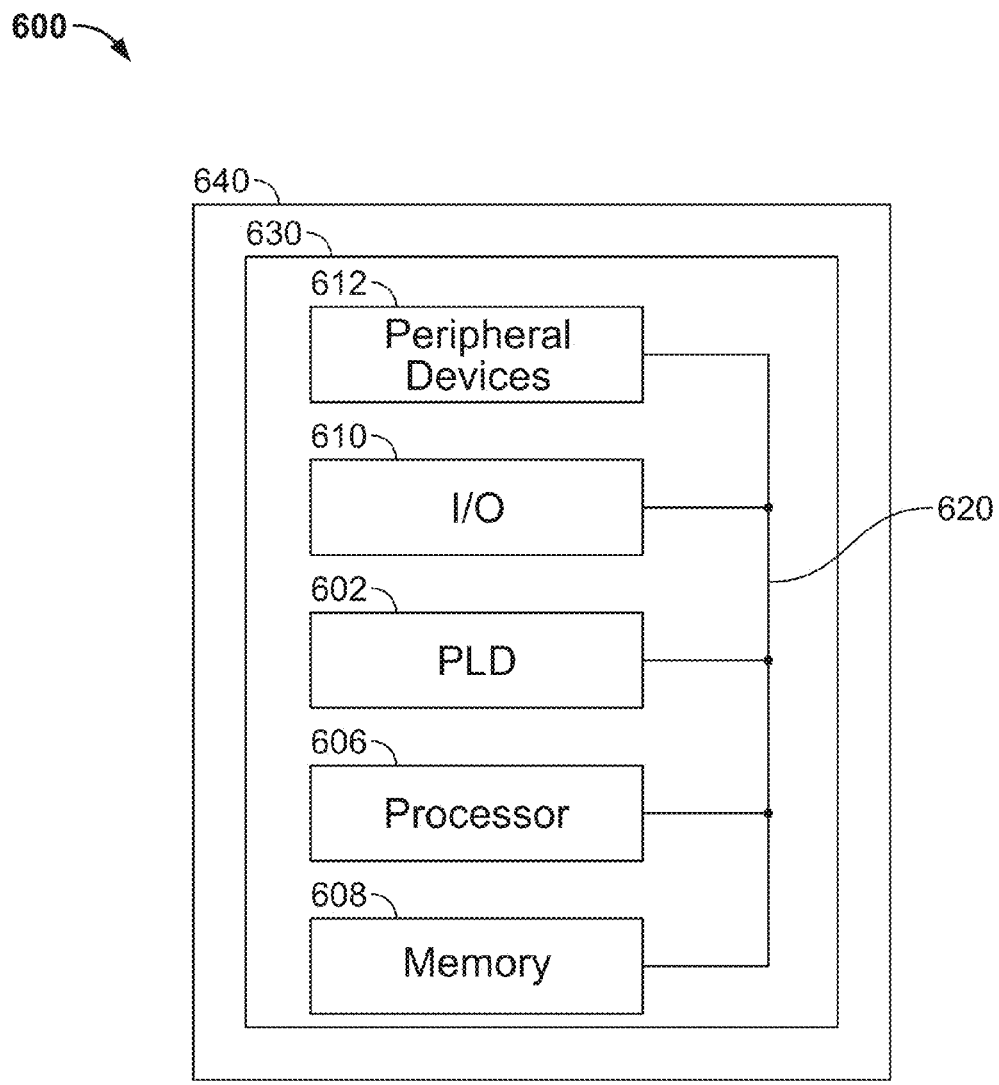
FIG. 6 is a simplified block diagram of an illustrative system employing an integrated circuit device configured using aspects of the present invention.

FIG. 6 illustrates a circuit or other device 602 that includes embodiments of a circuitry designed or configured based on the model described herein within a data processing system 600. In an embodiment, integrated circuit or device 602 may be an integrated circuit, application specific standard product (ASSP), application specific integrated circuit (ASIC), programmable logic device (PLD) (including a Field-Programmable Gate Array (FPGA), full-custom chip, or a dedicated chip). In some embodiments, element 602 may be designed or configured as PLL 100 or CDR PLL circuitry 200 based on the simulation method described herein. Data processing system 600 may include one or more of the following components: circuit 602, processor 606, memory 608, I/O circuitry 610, and peripheral devices 612. These components are connected together by a system bus or other interconnections 620 and are populated on a circuit board 630 which is contained in an end-user system 640.

System 600 could be used in a wide variety of applications, such as communications, computer networking, data networking, instrumentation, video processing, digital signal processing, or any other application where the advantage of using programmable or reprogrammable logic is desirable. Circuit 602 may be used to perform a variety of different logic functions. In some embodiments, circuit 602 may be configured as a processor or controller that works in cooperation with processor 606. Circuit 602 may also be used as an arbiter for arbitrating access to a shared resource in system 600. In yet another example, circuit 602 can be configured as an interface between processor 606 and one of the other components in system 600. It should be noted that system 600 is only exemplary, and that the true scope and spirit of the invention should be indicated by the following claims.

Although components in the above invention are described as being connected with one another, they may instead be connected to one another, possibly via other components in between them. It will be understood that the foregoing are only illustrative of the principles of the invention, and that various modifications can be made by those skilled in the art without departing from the scope and spirit of the invention. One skilled in the art will appreciate that the present invention can be practiced by other than the described embodiments, which are presented for purposes of illustration and not of limitation, and the present invention is limited only by the claims that follow.

The embodiments shown in this invention may save power and area, and in so doing, may also increase performance. Although these quantities may be easy to measure, the individual contributions of particular circuitry within the embodiments shown in this invention may be difficult to separate from contributions of other circuitry on any device or chip on which the circuitry are implemented.

Interactive interface applications and/or any instructions for layout of or use of the circuit designs of any the embodiments described herein may be encoded on computer readable media. Computer readable media includes any media capable of storing data. The computer readable media may be transitory, including, but not limited to, propagating electrical or electromagnetic signal, or may be non-transitory including, but not limited to, volatile and non-volatile computer memory or storage devices such as a hard disk, floppy disk, USB drive, DVD, CD, media cards, register memory, solid state memory, processor caches, Random Access Memory ("RAM"), etc.

It will be understood that the foregoing is only illustrative of the principles of the invention, and that various modifications may be made by those skilled in the art without departing from the scope and spirit of the invention, and the present invention is limited only by the claims that follow. For example, the various inventive aspects that have been discussed herein can either all be used together in certain embodiments, or other embodiments may employ only one or more (but less than all) of the inventive aspects. And if multiple (but less than all) of the inventive aspects are employed, that can involve employment of any combination of the inventive aspects. As another example of possible modifications, throughout this invention, particular numbers of components used in controllers are mentioned. These particular numbers are only examples, and other suitable parameter values can be used instead if desired.

What is claimed is:

1. A method for simulating a phase-locked loop, the method comprising:
    measuring a phase of a data signal and a phase of a reference clock signal in a phase-locked loop to be simulated;
    filtering the phase of the data signal by a threshold function of a lock detection module that removes outliers of the data signal that exceed a threshold of the threshold function of the phase-locked loop to be simulated; and
    adjusting the phase of the reference clock signal based on the data signal to align the phase of the reference clock signal with the filtered phase of the data signal.

2. The method of claim 1, wherein the adjusting of the phase of the reference clock signal further comprises:
    predicting an arrival time of a next data edge of the data signal based on a prediction model;
    calculating a difference between an actual arrival time of the next data edge and the predicted arrival time of the next data edge;
    determining whether the next data edge is valid based on the calculated difference; and
    in response to determining that the next data edge is valid, updating the prediction model based on the calculated difference.

3. The method of claim 2, further comprising notifying the lock detection module in response to determining that the next data edge is not valid.

4. The method of claim 1, wherein the threshold function of the lock detection module emulates a low-pass filter.

5. The method of claim 1, further comprising filtering the data signal and the reference clock signal to remove jitter and parts-per million (PPM) errors.

6. The method of claim 5, wherein the jitter and the PPM errors are represented by a rounding-off error having an upper boundary, and wherein the threshold function of the lock detection module compares the rounding-off error with a threshold.

7. The method of claim 1, further comprising:
    calculating an amount of lag in the data signal with respect to the reference clock signal; and
    applying a delay to the reference clock signal based on the calculated amount of lag.

8. The method of claim 7, wherein the amount of lag is calculated during initialization of the phase-locked loop.

9. The method of claim 1, further comprising implementing error conditions to simulate hardware behavior, wherein the error conditions include burst error, parts-per million (PPM) error, and accumulated error between data signal edges.

10. A programmable logic device configured as a phase-locked loop using a method of simulating the phase-locked loop, the programmable logic device being configured by:
    measuring a phase of a data signal and a phase of a reference clock signal in a phase-locked loop to be simulated;
    filtering the phase of the data signal by a threshold function of a lock detection module that removes outliers of the data signal that exceed a threshold of the threshold function of the phase-locked loop to be simulated; and
    adjusting the phase of the reference clock signal based on the data signal to align the phase of the reference clock signal with the filtered phase of the data signal.

11. The programmable logic device of claim 10, wherein, in the adjusting, the programmable logic device is configured by:
    predicting an arrival time of a next data edge of the data signal based on a prediction model;
    calculating a difference between an actual arrival time of the next data edge and the predicted arrival time of the next data edge;
    determining whether the next data edge is valid based on the calculated difference; and
    in response to determining that the next data edge is valid, updating the prediction model based on the calculated difference.

12. The programmable logic device of claim 11, the programmable logic device being further configured by notifying the lock detection module in response to determining that the next data edge is not valid.

13. The programmable logic device of claim 10, wherein the threshold function of the lock detection module emulates a low-pass filter.

14. The programmable logic device of claim 10, the programmable logic device being further configured by filtering the data signal and the reference clock signal to remove jitter and parts-per million (PPM) errors.

15. The programmable logic device of claim 14, wherein the jitter and the PPM errors are represented by a rounding-off error having an upper boundary, and wherein the threshold function of the lock detection module compares the rounding-off error with a threshold.

16. The programmable logic device of claim 10, the programmable logic device being further configured by:
   calculating an amount of lag in the data signal with respect to the reference clock signal; and
   applying a delay to the reference clock signal based on the calculated amount of lag.

17. The programmable logic device of claim 16, wherein the amount of lag is calculated during initialization of the phase-locked loop.

18. The programmable logic device of claim 10, the programmable logic device being further configured by implementing error conditions to simulate hardware behavior, wherein the error conditions include burst error, parts-per million (PPM) error, and accumulated error between data signal edges.

19. A non-transitory computer-readable medium storing a plurality of instructions for simulating a phase-locked loop, the plurality of instructions comprising:
   an instruction to measure a phase of a data signal and a phase of a reference clock signal in a phase-locked loop to be simulated;
   an instruction to filter the phase of the data signal by a threshold function of a lock detection module that removes outliers of the data signal that exceed a threshold of the threshold function of the phase-locked loop to be simulated; and
   an instruction to adjust the phase of the reference clock signal to align with the filtered phase of the data signal.

20. The non-transitory computer-readable medium of claim 19, wherein the instruction that adjusts the phase of the reference clock signal further comprises:
   an instruction to predict an arrival time of a next data edge of the data signal based on a prediction model;
   an instruction to calculate a difference between an actual arrival time of the next data edge and the predicted arrival time of the next data edge;
   an instruction to determine whether the next data edge is valid based on the calculated difference; and
   an instruction to update the prediction model based on the calculated difference in response to the next data edge is determined to be valid.

21. The non-transitory computer-readable medium of claim 20, wherein the plurality of instructions further comprises an instruction to notify the lock detection module in response to determining that the next data edge is not valid.

22. The non-transitory computer-readable medium of claim 19, wherein the threshold function of the lock detection module emulates a low-pass filter.

23. The non-transitory computer-readable medium of claim 19, wherein the plurality of instructions further comprises an instruction to filter the data signal and the reference clock signal to remove jitter and parts-per million (PPM) errors.

24. The non-transitory computer-readable medium of claim 23, wherein the jitter and the PPM errors are represented by a rounding-off error having an upper boundary, and wherein the threshold function of the lock detection module compares the rounding-off error with a threshold.

25. The non-transitory computer-readable medium of claim 19, wherein the plurality of instructions further comprises:
   an instruction to calculate an amount of lag in the data signal with respect to the reference clock signal; and
   an instruction to apply a delay to the reference clock signal based on the calculated amount of lag.

26. The non-transitory computer-readable medium of claim 25, wherein the amount of lag is calculated during initialization of the phase-locked loop.

27. The non-transitory computer-readable medium of claim 19, wherein the plurality of instructions further comprises an instruction to implement error conditions to simulate hardware behavior, wherein the error conditions include burst error, parts-per million (PPM) error, and accumulated error between data signal edges.

* * * * *